United States Patent
Hynecek (10) Patent No.: US 9,231,007 B2
(45) Date of Patent: *Jan. 5, 2016

(54) IMAGE SENSORS OPERABLE IN GLOBAL SHUTTER MODE AND HAVING SMALL PIXELS WITH HIGH WELL CAPACITY

(71) Applicant: Semiconductor Components Industries, LLC, Phoenix, AZ (US)

(72) Inventor: Jaroslav Hynecek, Allen, TX (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/468,186

(22) Filed: Aug. 25, 2014

(65) Prior Publication Data
US 2015/0060951 A1 Mar. 5, 2015

Related U.S. Application Data

(60) Provisional application No. 61/870,339, filed on Aug. 27, 2013.

(51) Int. Cl.
| | |
|---|---|
| H01L 27/146 | (2006.01) |
| H01L 29/768 | (2006.01) |
| H01L 27/148 | (2006.01) |
| H04N 5/3745 | (2011.01) |

(52) U.S. Cl.
CPC ...... *H01L 27/14612* (2013.01); *H01L 27/1463* (2013.01); *H01L 27/1464* (2013.01); *H01L 27/14614* (2013.01); *H01L 27/14643* (2013.01); *H01L 27/14654* (2013.01); *H04N 5/37452* (2013.01)

(58) Field of Classification Search
CPC .......... H01L 27/14609; H01L 27/14612; H01L 27/14689; H04N 5/37452
See application file for complete search history.

(56) References Cited

U.S. PATENT DOCUMENTS

| | | | |
|---|---|---|---|
| 8,247,853 B2 | 8/2012 | Hynecek | |
| 8,502,290 B2 | 8/2013 | Mao et al. | |
| 8,558,293 B2 * | 10/2013 | Kawahito et al. | 257/292 |
| 8,716,719 B2 * | 5/2014 | Matsumura et al. | 257/80 |
| 8,786,745 B2 * | 7/2014 | Kawahito et al. | 348/296 |
| 9,041,132 B2 * | 5/2015 | Kobayashi et al. | 257/431 |
| 2006/0046338 A1 * | 3/2006 | Patrick et al. | 438/57 |
| 2013/0146747 A1 | 6/2013 | Hynecek | |

OTHER PUBLICATIONS

Hynecek, U.S. Appl. No. 14/189,382, filed Feb. 25, 2014.

* cited by examiner

*Primary Examiner* — Victor A Mandala
*Assistant Examiner* — Regan J Rundio
(74) *Attorney, Agent, or Firm* — Treyz Law Group; Kendall P. Woodruff (57) ABSTRACT

An image sensor operable in global shutter mode ma include small pixels with high charge storage capacity, low dark current, and no image lag. Storage capacity of a photodiode and a charge storage diode may be increased by placing a p+ type doped layer under the photodiode and the charge storage diode. The p+ type doped layer ma include an opening for allowing photo-generated charge carriers to flow from the silicon bulk to the charge storage well located near the surface of the photodiode. A compensating n− type doped implant may be formed in the opening. Image lag is prevented by placing a p− type doped region under the p+ type doped photodiode pinning layer and aligned with the opening. The p+ type doped layer may extend under the entire pixel array.

20 Claims, 5 Drawing Sheets

IMAGE SENSORS OPERABLE IN GLOBAL SHUTTER MODE AND HAVING SMALL PIXELS WITH HIGH WELL CAPACITY

This application claims the benefit of provisional patent application No. 61/870,339 filed Aug. 27, 2013, which is hereby incorporated by reference herein in its entirety.

BACKGROUND

This relates to solid-state image sensors and, more specifically, to image sensors capable of operating in global shutter mode and having small pixels with high well capacity.

Typical image sensors sense light by converting impinging photons into electrons or holes that are integrated (collected) in sensor pixels. After completion of an integration cycle collected charge is converted into a voltage, which is supplied to the output terminals of the sensor. In complementary metal oxide semiconductor (CMOS) image sensors, the charge to voltage conversion is accomplished directly in the pixels themselves and the analog pixel voltage is transferred to the output terminals through various pixel addressing and scanning schemes. The analog signal can be also converted on-chip to a digital equivalent before reaching the chip output. The pixels have incorporated in them a buffer amplifier, typically a source follower (SF), which drives the sense lines that are connected to the pixels by suitable addressing transistors.

After charge to voltage conversion is completed and the resulting signal transferred out from the pixels, the pixels are reset in order to be ready for accumulation of new charge. In pixels that use a floating diffusion (FD) as the charge detection node, the reset is accomplished by turning on a reset transistor that conductively connects the floating diffusion node to a voltage reference, which is typically the pixel drain node. This step removes collected charge; however, it also generates kTC-reset noise as is well known in the art. This kTC-reset noise is removed from the signal using a Correlated Double Sampling (CDS) signal processing technique in order to achieve the desired low noise performance. CMOS image sensors that utilize a CDS technique usually include three transistors (3 T) or four transistors (4 T) in the pixel, one of which serves as the charge transferring (Tx) transistor. It is possible to share some of the pixel circuit transistors among several photodiodes, which also reduces the pixel size. An example of a 4 T pixel circuit with pinned photodiode can be found in U.S. Pat. No. 5,625,210 to Lee, incorporated herein as a reference.

Figure 1:
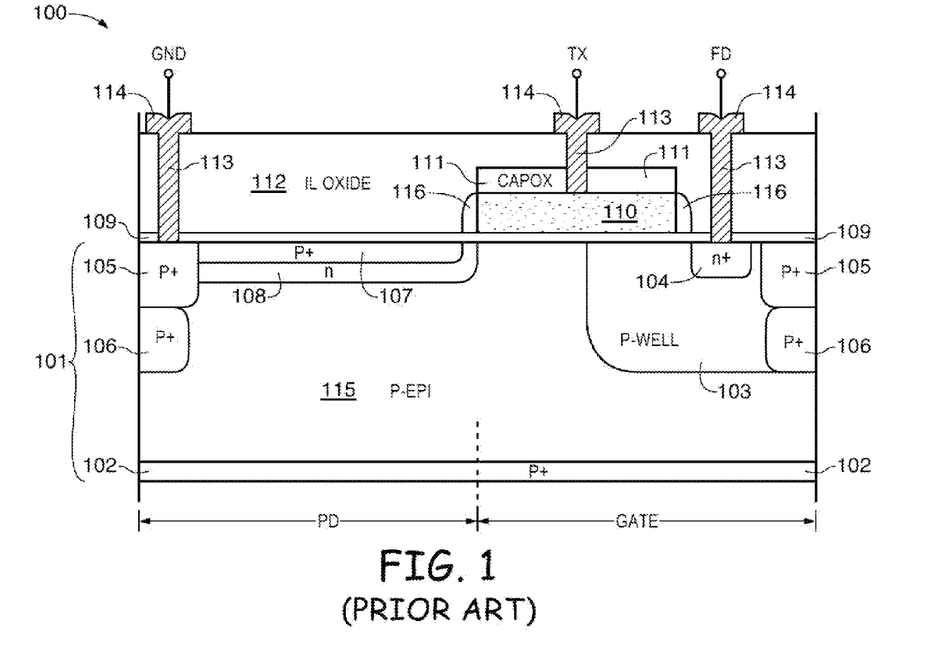
FIG. 1 is a cross-sectional side view of a conventional image sensor pixel.

FIG. 1 is a simplified cross-sectional view of a portion of a typical image sensor pixel 100. As shown in FIG. 1, image sensor pixel 100 includes a pixel photodiode (PD) that collects photon-generated carriers, a charge transfer gate 110 of a charge transfer transistor, and a floating diffusion 104. The pixel is fabricated in a substrate 101 having a p+ type doped layer 102 deposited on a back surface. The device substrate 101 also includes an epitaxial p− type doped layer 115 situated above the p+ type doped layer 102. The photons that enter this region generate carriers that are collected in the potential well of the photodiode (PD) formed in region 108.

The surface of epitaxial layer 115 is covered by an oxide layer 109 that isolates the doped poly-silicon charge transfer gate Tx 110 from the substrate. A masking cap oxide 111 is deposited on an upper surface of poly-silicon gate 110, which serves as a patterning hard mask as well as an additional blocking mask for the ion implantation that forms the photodiode charge storage region. The photodiode is formed by an n− type doped layer 108 and a p+ type doped potential pinning layer 107.

Sidewall spacers 116 are sometimes incorporated to control the mutual edge positions of p+ type doped layer 107 and charge storage layer 108. The floating diffusion diode 104 that senses charge transferred from the photodiode is connected to the pixel source follower transistor (not shown). The floating diffusion, source follower, and the remaining pixel circuit components are all built in the p− type doped well 103 that diverts photon-generated charge into the photodiode potential well located in layer 108. The pixels are isolated from each other by p+ type doped regions 105 and 106, which may extend all the way to the p+ type doped layer 102. The whole pixel is covered by several inter-level (IL) oxide layers 112, (only one is shown in FIG. 1) that are used for pixel metal wiring and interconnect isolation. The pixel active circuit components are connected to the wiring by metal via plugs 114 deposited through contact holes 113.

Pixel well capacity is determined primarily by the capacitance between p+ type doped layer 107 and charge storage layer 108. By increasing the doping levels in these layers, it is possible to achieve close-to-abrupt doping profiles in the vertical direction in these layers and approach the maximum electric field intensity permissible in the silicon before breakdown. Some contribution to charge storage capacitance is also obtained from the capacitance between n− type doped layer 108 and pixel p+ type doped separation layers 105 and 106. However, due to ion implantation doping profile straggle in the lateral direction, it is not generally possible to achieve the same abrupt doping profile characteristic in this direction as in the vertical direction. There is also almost no storage well capacity contribution from the capacitance between layer 108 and substrate p− type epitaxial doping region 115.

Image sensors are being fabricated with smaller and smaller pixels. It is not uncommon for pixels to have sub-micron dimensions. When pixel size is reduced, the area of doping layers 108 and 107 is also reduced, which in turn leads to a loss in well capacity. An improvement in storage well capacity in small size pixels is discussed in U.S. Pat. No. 8,247,853 to Hynecek, which is hereby incorporated by reference herein in its entirety.

Additional challenges arise when image sensors operable in global shutter mode are provided with smaller pixels. For global shutter operation, it is necessary to incorporate another storage site into each pixel to store charge that is transferred from the photodiode after a global transfer operation and to hold the charge until it can be read out in a row-by-row fashion.

Figure 2:
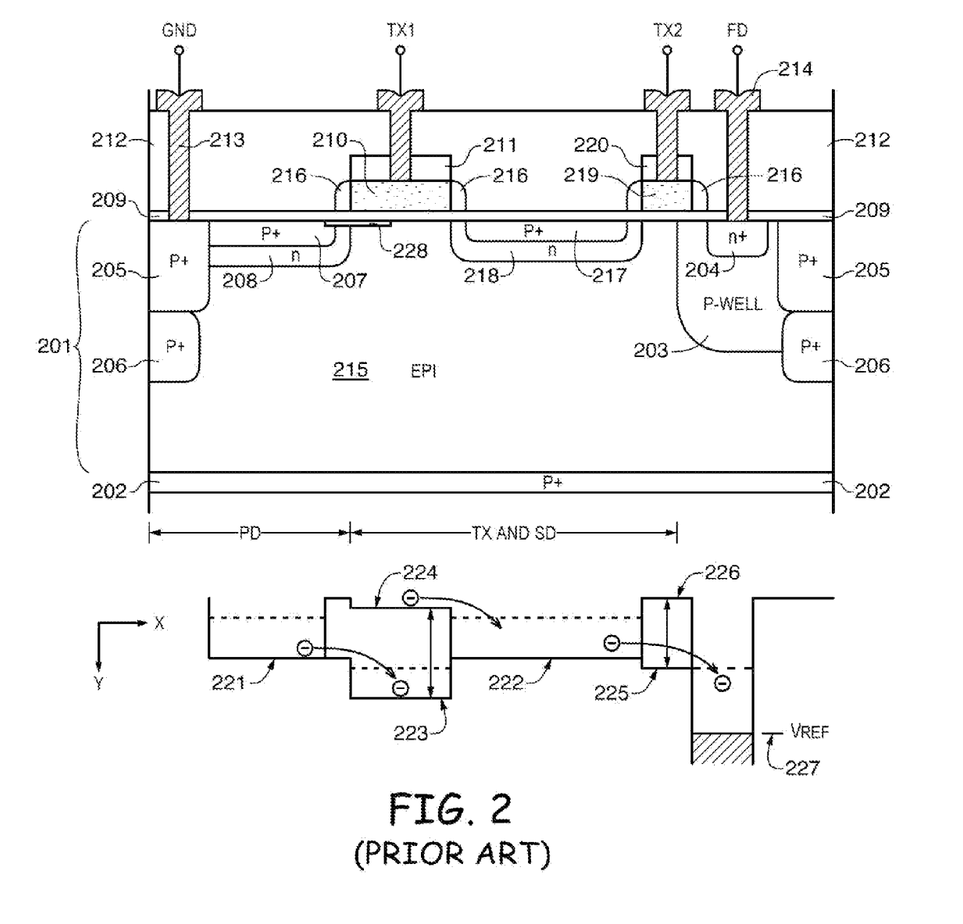
FIG. 2 is a diagram of a conventional image sensor pixel capable of operating in global shutter mode.

FIG. 2 is a cross-sectional side view of a conventional image sensor having circuitry for operating in global shutter mode. FIG. 2 also shows the corresponding maximum potential profile under each region of the pixel.

Image sensor 200 of FIG. 2 includes a pixel photodiode (PD) that collects photon-generated carriers, a charge transfer gate 210 of a charge transfer transistor, and a floating diffusion (FD) 204. The pixel is fabricated in a substrate 201 having a p+ type doped layer 202 deposited on a back surface. The device substrate 201 also includes an epitaxial p− type doped layer 215 situated above the p+ type doped layer 202. The photons that enter this region generate carriers that are collected in the potential well of the photodiode formed in region 208.

The surface of epitaxial layer 215 is covered by an oxide layer 209 that isolates the doped poly-silicon charge transfer gate Tx1 210 from the substrate. A masking cap oxide 211 is deposited on an upper surface of poly-silicon gate 240, which serves as a patterning hard mask as well as an additional blocking mask for the ion implantation that forms the photodiode charge storage region. The photodiode is formed by an n− type doped layer 208 and a p+ type doped potential pinning layer 207. Sidewall spacers 216 are sometimes incorporated to control the mutual edge positions of p+ type doped layer 207 and charge storage layer 208.

The floating diffusion diode 204 that senses charge transferred from the photodiode is connected to the pixel source follower transistor (not shown). The floating diffusion diode, source follower transistor, and the remaining pixel circuit components are all built in the p− type doped well 203 that diverts photon-generated charge into the photodiode potential well located in layer 208. The pixels are isolated from each other by p+ type doped regions 205 and 206, which may extend all the way to the p+ type doped layer 202. The whole pixel is covered by several inter-level (IL) oxide layers 212 (only one is shown in FIG. 2) that are used for pixel metal wiring and interconnect isolation. The pixel active circuit components are connected to the wiring by metal via plugs 214 deposited through contact holes 213.

To implement global shutter functionality, image sensor 200 includes a storage diode (SD) well 218 and a corresponding pinning implant 217. These are fabricated at the same time that regions 208 and 207 are fabricated, using the same implant doses and energies. A second transfer gate (Tx2) is used for transferring charge from the storage diode well 218 to the floating diffusion node 204 during row-by-row sequential readout operations.

Global shutter is activated by applying a pulse to the transfer gate (Tx1). This gate has an additional implanted region 228 under a portion of its gate, which forms a potential barrier preventing charge from flowing back into the photodiode during charge transfer to the storage region. Applying a pulse to the Tx1 gate results in a potential profile change under the gate from level 224 to level 223 and back to level 224. Charge that has accumulated in the photodiode potential well 221 during the integration period is thus transferred to storage well 222.

During a readout cycle, the Tx2 gates of the selected row are pulsed, which results in a maximum potential profile change under the Tx2 gate from level 226 to level 225 and back to level 226. This causes the charge carriers to flow to the floating diffusion region and change its potential from its reset level 227. This change is sensed by the SF transistor and delivered to the array row processing circuits located at the periphery of the image sensor.

As shown in FIG. 2, the pixel storage diode (SD) area occupies almost the same area of the pixel as the photodiode (PD). This can in turn lead to challenges when fabricating an image sensor with small pixels. For example, forming a conventional pixel of the type shown in FIG. 2 with sub-micron dimensions can have adverse effects on pixel charge storage capacity, dark current, image lag, and overall image sensor performance.

It would therefore be desirable to be able to provide improved image sensors such as image sensors operable in global shutter mode and having small image sensor pixels (e.g., pixels with sub-micron dimensions).

DETAILED DESCRIPTION

Electronic devices such as digital cameras, computers, cellular telephones, and other electronic devices include image sensors that gather incoming light to capture an image. An image sensor may include an array of image sensor pixels (sometimes referred to as pixels or image pixels). The image sensor pixels in an image sensor may each include a photosensitive element such as a photodiode that converts incoming light into electric charge. The electric charge may be stored and converted into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image sensor pixels and readout circuitry for reading out image signals corresponding to the electric charge generated by the photosensitive elements.

Figure 3:
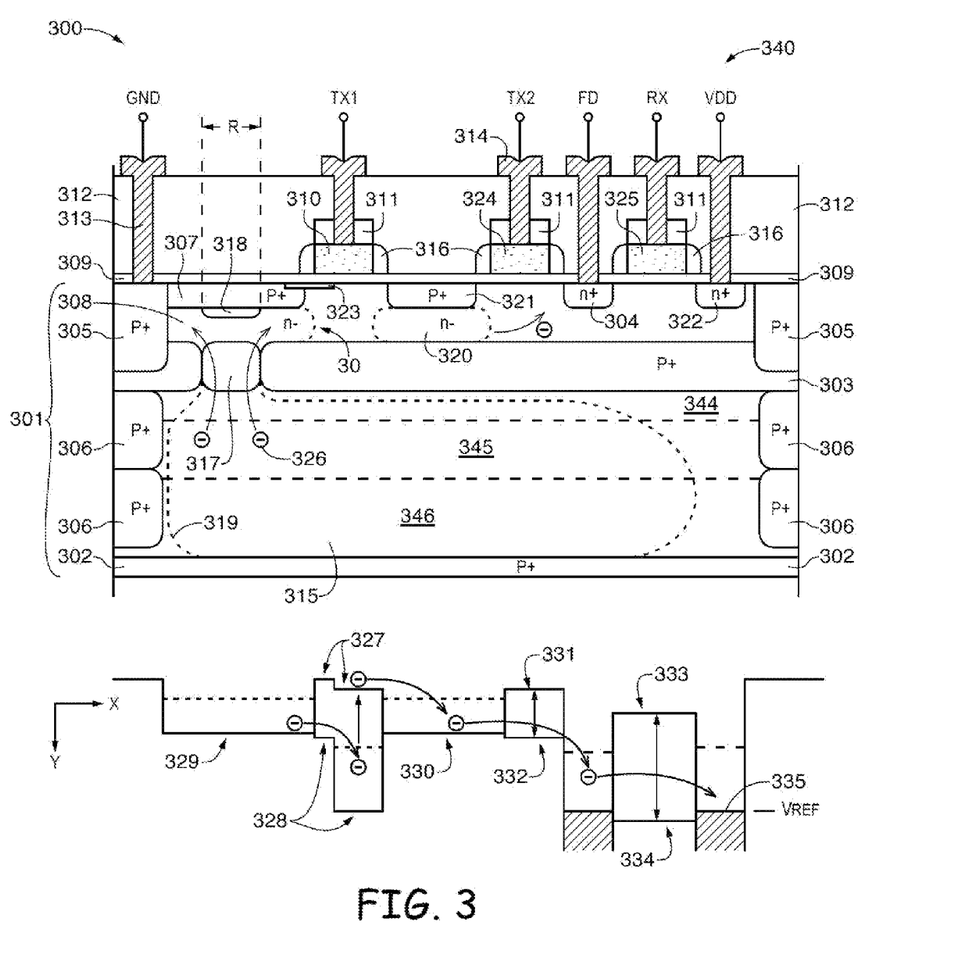
FIG. 3 is a diagram of an illustrative image sensor pixel capable of operating in global shutter mode and having a p+ type doped layer under a photodiode and charge storage diode for increased charge storage well capacity in accordance with an embodiment of the present invention.

FIG. 3 is a diagram showing a simplified cross-sectional side view of a portion of an image sensor showing an illustrative image sensor pixel 300 in a pixel array 340. Although only one pixel is shown in FIG. 3, pixel array 340 may include any suitable number of image sensor pixels 300. Each image sensor pixel 300 in pixel array 340 may, if desired, have a configuration of the type shown in FIG. 3. Pixels 300 may, for example, be pixels having sub-micron dimensions.

As shown in FIG. 3, image sensor pixel 300 may include a device substrate such as silicon substrate 301. Substrate 301 may include a p+ type doped layer 302 and an epitaxial p− type doped layer such a p− type epitaxial layer 315 situated above p+ type doped layer 302. Photons that enter this region may generate carriers such as photon-generated carriers 326. Photon-generated carriers 326 may be collected in the potential well of photodiode (PD) 30 formed in region 308. The use of p+ type doped layer 302 may help prevent the generation of excessive dark current by the interface states.

The surface of epitaxial layer 315 may be covered by an oxide layer such as oxide layer 309. Oxide layer 309 may be used to isolate doped poly-silicon gates such as charge transfer gate 310 from substrate 301. A masking cap oxide such as masking cap oxide 311 may be deposited on an upper surface of poly-silicon gate 310, which serves as a patterning hard mask as well as an additional blocking mask for the ion implantation that forms the photodiode charge storage region. A p− type implant 323 may be incorporated under a portion of transfer gate 310 to help prevent charge from spilling back into the photodiode when the gate is pulsed from its high bias level back to its low bias level.

Photodiode 30 in pixel 300 is formed by charge storage layer 308 (e.g., an n− type doped layer) and p+ type doped potential pinning layer 307, which may help reduce the interface states generated dark current (similarly to p+ type doped layer 302). If desired, spacers such as sidewall spacer structures 316 may be used to control the mutual edge positions of p+ type doped layer 307 and charge storage layer 308.

When first transfer gate 310 (Tx1) is pulsed, charge is transferred from photodiode 30 to storage diode (SD) storage region 320. Storage diode may, for example, be formed as a pinned diode by n− type doped storage region 320 and a p+ type doped pinning layer 321 incorporated near the silicon surface. Similar to pinning layer 307, pinning layer 321 may help reduce dark current.

Charge from storage diode region 320 may be transferred onto floating diffusion node 304 by applying a pulse to second transfer gate 324 (Tx2). A masking cap oxide such as masking cap oxide 311 may be deposited on an upper surface of poly-silicon gate 324. If desired, sidewall spacers 316 may also be used.

A floating diffusion (FD) diode such as floating diffusion node 304 may be used to sense charge transferred from storage diode region 320 (e.g., charge that is accumulated in photodiode 30 and then transferred to storage diode region 320). Floating diffusion node 304 may be connected to a pixel source follower (SF) transistor gate (not shown). Floating diffusion node 304 may be reset by applying a pulse to reset gate 325 (Rx). Reset gate 325 may have the same structure as gates 310 (Tx1) and 324 (Tx2) including hard cap oxide 311 and sidewall spacers 316. Reset gate 325 interfaces with drain 322, which may be biased to a common array bias such as bias VDD. If desired, drain 322 may be biased using a separate bias.

Photodiode 30 may interface with another gate such as a photodiode reset gate (not shown in FIG. 3). The photodiode reset gate ma reset the photodiode by removing all charge from the photodiode. The photodiode reset gate may also be used for blooming control. For example, the photodiode reset gate may be biased to a suitable level during a charge integration period to help prevent blooming. This type of anti-blooming/reset gate is described below in connection with FIG. 4.

Pixels may be isolated from each other by several p− type doped implants such as p− type doped implants 305 and 306, which may extend all the way to p+ type doped layer 302. Image sensor pixel 300 may be covered by several inter-level (IL) oxide layers 312 (only one is shown in FIG. 3). IL oxide layers 312 may be used for interconnect isolation and may include conductive interconnects such as metal pixel wiring. Active circuit components in pixel 300 may be connected to metal wiring in IL oxide layers 312 using conductive material such as metal via 314 (sometimes referred to as metal plugs). Metal plugs 314 may be deposited in contact via holes in layer 312 such as contact via holes 313.

FIG. 3 includes a simplified potential diagram showing an illustrative maximum potential profile for image sensor pixel 300. Each portion of the potential diagram represents an illustrative potential level for an overlapping portion of pixel 300 in FIG. 3.

Applying a pulse to charge transfer gate 310 (Tx1) results in a potential profile change under this gate from level 327 to level 328 and back to level 327. Charge that has accumulated in the photodiode potential well 329 during an integration period is thus transferred to storage diode region 320 having a potential level 330. In global shutter mode, this charge transfer operation may be performed for the entire array 340 of pixels 300 simultaneously (e.g., transfer gate 310 of every pixel may be pulsed at the same time to transfer charge from each photodiode 30 to a respective charge storage region 320).

During a readout cycle, all of the charge transfer gates 324 (Tx2) in a selected row are pulsed, which results in a potential profile change under the gate 324 (Tx2) from level 331 to level 332 and back to level 331. This causes carriers to flow to floating diffusion region 304 and thereby change its potential from its reset level 335. This change is sensed by a source follower transistor and delivered to the array processing circuits located at the periphery of the image sensor pixel array 340. Floating diffusion node 304 is reset by applying a pulse to the gate of the reset transistor, which causes a potential under this gate to change from level 333 to level 334 and back to level 333. Floating diffusion node 304 is thus reset to a reference level such as reference voltage Vref and is ready for receiving new charge for readout.

A p+ type doped layer such as p+ type doped layer 303 may be deposited under some or all of the entire pixel array 340. As shown in FIG. 3, p+ type doped layer 303 is located under photodiode 30 and extends parallel to the surface of substrate 301 in which photodiodes 30 are formed. For example, p+ type doped layer 303 may be deposited under pixel transistors such as source follower transistors, row addressing transistors, floating diffusion node reset transistors, and photodiode reset transistors in pixel array 340. P+ type doped layer 303 may be coupled to ground biased layers 305 and 306 and may be used to increase the charge storage capacitance of photodiode 30 and charge storage diode region 320. An opening such as opening 317 may be formed in p+ type doped layer 303 in order to allow charge carriers 326 (e.g., electrons), which are generated by impinging photons, to flow from the silicon bulk into the storage well located in n− type doped region 308. Opening 317 may be formed by implanting a compensating n− type doped region in layer 303.

If care is not taken, electrons accumulated in a compensating region may not be able to be transferred to the floating diffusion node, which could potentially cause image lag. To avoid this problem, an additional p− type doped implant region such as p− type doped implant region 318 may be formed near the surface of photodiode 30. If desired p− type doped implant region 318 may be formed using the same mask that is used for implant 317 in region 303. As shown in FIG. 3, p− type doped implant region 318 is aligned with compensating n− type doped region 317 in layer 303 (e.g., p− type doped implant region 318 and n− type doped region 317 may have the same width R).

All of the charge generated in the bulk of silicon epitaxial layer 315 may therefore be directed to flow to a single storage region 308. The potential gradient for this electron flow is created by additional n− type implants 344, 345, and 346 in silicon hulk 315. This results in the formation of a large pixel depletion region under the whole pixel, as indicated by depletion region boundary 319. The large depleted region under the image sensor pixel may help reduce pixel crosstalk.

The example of FIG. 3 in which image sensor pixel 300 is a backside illuminated image sensor pixel is merely illustrative. If desired, image sensor pixel 300 may be a front side illuminated image sensor pixel. Pixel array 340 in which pixel 300 is formed may be provided with a color filter array. In backside illuminated image sensors, the color filters may be deposited on the backside of the silicon substrate. In front side illuminated image sensors, the color filters may be deposited on the front side of the silicon substrate. A micro-lens array may be deposited over the color filter array to improve quantum efficiency and reduce pixel crosstalk.

Figure 4:
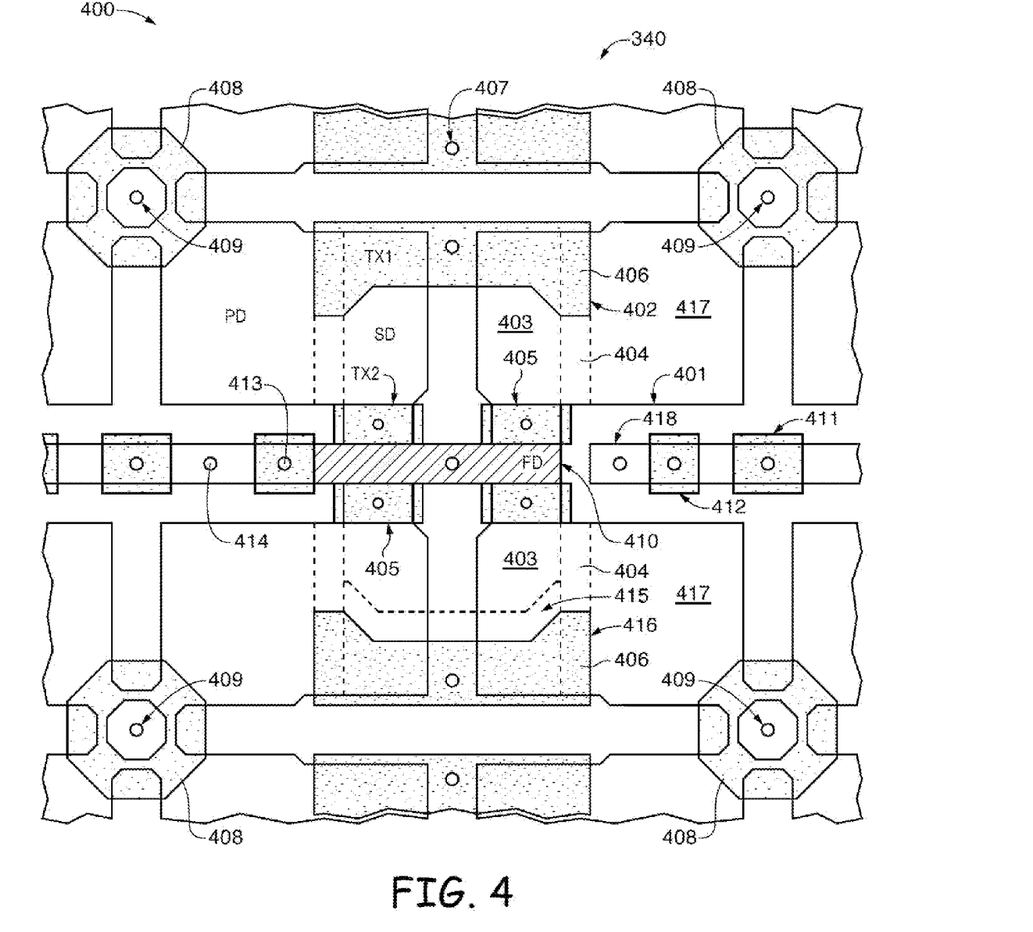
FIG. 4 is a diagram of illustrative pixel topology showing a layout of a group of four pixels that share a common readout circuit in accordance with an embodiment of the present invention.

If desired, pixel circuitry such as the source follower transistor, photodiode reset and blooming control transistor, and the addressing transistor, may be shared among multiple pixels. An example of a shared pixel layout is shown in FIG. 4. As shown in FIG. 4, pixel group 400 of pixel array 340 may include four pixels arranged in a 2×2 formation. For simplicity, via such as via 407 are shown in FIG. 4 but other circuitry components such as metal interconnect wiring is not shown in FIG. 4.

The active region of each pixel in pixel group 400 is indicated by line 401. A first transfer gate (Tx1) such as transfer gate 402 may be shared between two neighboring pixels in the same row. A p− type impurity implant 406 may be implanted under a portion of transfer gate 402 (Tx1) to provide a potential barrier against charge spilling back to photodiode 417. Photodiode 417 and charge storage diode region 403 may be isolated from each other by a barrier such as barrier 404. Barrier 404 may include an additional p− type doped implant.

A second transfer gate (Tx2) such as transfer gate 405 interfaces with storage diode region 403 on one side and floating diffusion region 410 on an opposing side. Floating diffusion region 410 may be shared among all four pixels of group 400. Pixel group 400 further includes gate 411 of a source follower transistor, gate 412 of an addressing transistor, gate 413 of a floating diffusion reset transistor, and a pixel circuit drain 414.

If desired, the first transfer gate (Tx1) may have a reduced size as shown in the lower two pixels of pixel group 400. As shown in FIG. 4, a barrier such as barrier 415 may be implanted in storage diode region 403. With this type of arrangement, first transfer gate 416 (Tx1) may be pulsed multiple times to achieve a complete charge transfer from photodiode region 417 to storage diode region 403. The example of FIG. 4 in which the pixels of pixel group 400 have different configurations (e.g., where the first transfer gate 416 of the lower two pixels of group 400 is smaller than the first transfer gate 403 of the upper two pixels of group 400) is merely illustrative. If desired, the pixels in each pixel group 400 may have the same configuration or may have slightly different configurations.

Reset of photodiode region 417 may be accomplished using a reset transistor having a gate 408 and a drain 409. The reset structure may, if desired, be shared among all four pixels in pixel group 400. Pixel signals may be output to the source of a pixel addressing transistor such as source 418.

The examples of FIGS. 3 and 4 in which pixel array 340 is described as operating in global shutter mode is merely illustrative. If desired, pixel arrays such as pixel array 340 having circuitry for operating in global shutter mode may be operated in rolling shutter mode. The particular mode of operation depends on the timing and operation of first transfer gate Tx1 and second transfer gate Tx2. For global shutter mode, all of the Tx1 gates in the pixel array are pulsed at the same time, and the Tx2 gates are operated sequentially. In rolling shutter mode, both the Tx1 gates and the Tx2 gates are operated sequentially in a row-by-row fashion.

Figure 5:
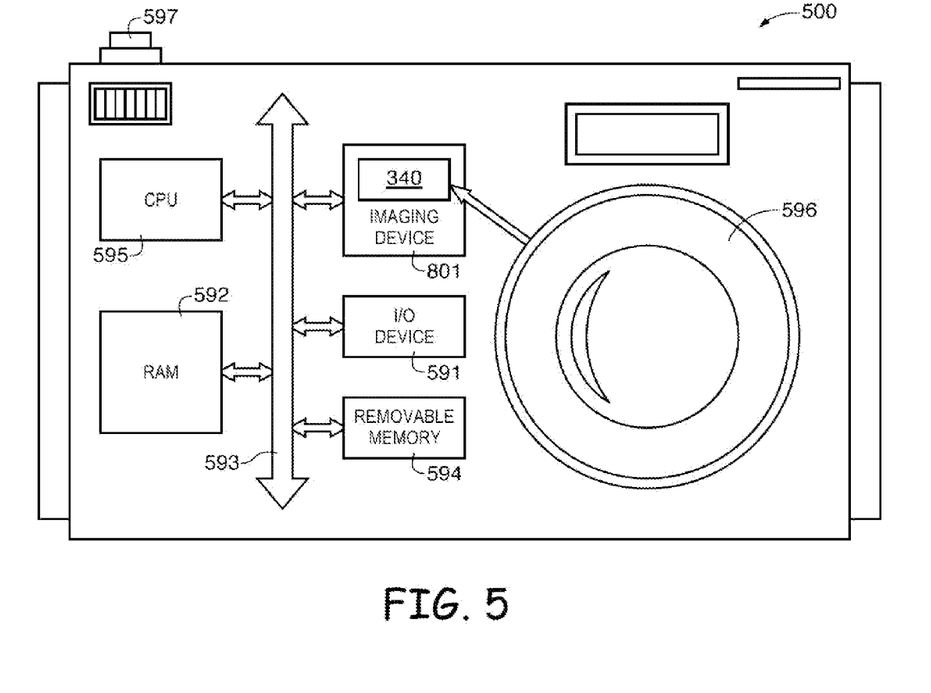
FIG. 5 is a block diagram of a system employing the embodiments of FIGS. 3 and 4 in accordance with an embodiment of the present invention.

FIG. 5 shows in simplified, form a typical processor system 500, such as a digital camera, which includes an imaging device 801. Imaging device 801 may include a pixel array 340 having pixels 300 of the type shown in FIGS. 3 and 4 formed on an image sensor SOC. Processor system 500 is exemplary of a system having digital circuits that may include imaging device 801. Without being limiting, such a system may include a computer system, still or video camera system, scanner, machine vision vehicle navigation, video phone, surveillance system, auto focus system, star tracker system, motion detection system, image stabilization system, and other systems employing an imaging device.

Processor system 500, which may be a digital still or video camera system, may include a lens such as lens 596 for focusing an image onto a pixel, array such as pixel array 340 when shutter release button 597 is pressed. Processor system 500 may include a central processing unit such as central processing unit (CPU) 595. CPU 595 may be a microprocessor that controls camera functions and one or more image flow functions and communicates with one or more input/output (I/O) devices 591 over a bus such as bus 593. Imaging device 801 may also communicate with CPU 595 over bus 593. System 500 may include random access memory (RAM) 592 and removable memory 594. Removable memory 594 may include flash memory that communicates with CPU 595 over bus 593. Imaging device 801 may be combined with CPU 595, with or without memory storage, on a single integrated circuit or on a different chip. Although bus 593 is illustrated as a single bus, it may be one or more buses or bridges or other communication paths used to interconnect the system components.

Various embodiments have been described illustrating small image sensor pixels with high well capacity. This is accomplished by incorporating a special p+ type doped layer under the photodiode. The p+ type doped layer may include an opening for allowing photo-generated carriers to flow from the silicon bulk to the photodiode storage region. A compensating n− type doped implant region may be formed in the opening. The p+ type doped layer may extend under the entire array of image sensing pixels and may increase the storage capacity of a photodiode and charge storage diode in each image sensing pixel.

The foregoing embodiments are intended to be illustrative and not limiting; it is noted that persons skilled in the art can make modifications and variations in light of the above teachings. It is therefore to be understood that changes may be made in the particular embodiments of the invention disclosed, which are within the scope and spirit of the invention as defined by the appended claims. The foregoing is merely illustrative of the principles of this invention which can be practiced in other embodiments.

What is claimed is:

1. An image sensor pixel in a pixel array having a silicon substrate, comprising:
    a photodiode and a charge storage diode formed in a surface of the silicon substrate, wherein the silicon substrate includes a bulk portion under the photodiode and the charge storage diode;
    a p+ type doped layer that extends under the photodiode and the charge storage diode parallel to the surface, wherein the p+ type doped layer comprises an opening through which charge carriers pass from the bulk portion of the silicon substrate to the photodiode; and
    a compensating n-type doped implant region in the opening.

2. The image sensor pixel defined in claim 1 further comprising a p-type doped implant region interposed between the photodiode and the compensating n-type doped implant region, wherein the p-type doped implant region is aligned with the compensating n-type doped implant region.

3. The image sensor pixel defined in claim 2 wherein the p-type doped layer is connected to ground biased layers.

4. The image sensor pixel defined in claim 2 further comprising a transfer gate formed on the surface of the silicon substrate, wherein the transfer gate transfers charge carriers from the photodiode to the charge storage diode.

5. The image sensor pixel defined in claim 4 further comprising a floating diffusion node.

6. The image sensor pixel defined in claim 5 further comprising an additional transfer gate formed on the surface of the silicon substrate, wherein the additional transfer gate transfers the charge carriers from the charge storage diode to the floating diffusion node.

7. The image sensor pixel defined in claim 4 wherein the transfer gate is shared with an adjacent image sensor pixel.

8. The image sensor pixel defined in claim 2 further comprising a plurality of n− type doped regions formed in the bulk portion of the silicon substrate, wherein the plurality of n−type doped regions form a potential gradient that directs charge carriers from the bulk portion of the silicon substrate through the opening.

9. The image sensor pixel defined in claim 2 further comprising a plurality of pixel separation implants that separate the image sensor pixel from other image sensor pixels in the pixel array.

10. The image sensor pixel defined in claim 1 wherein the image sensor pixel is a backside illuminated image sensor pixel operable in global shutter mode.

11. An image sensor having an array of image sensor pixels and a silicon substrate, the image sensor comprising:
   a plurality of photodiodes and a plurality of charge storage diodes formed in a surface of the silicon substrate, wherein the silicon substrate includes a bulk portion under the plurality of photodiodes and the plurality of charge storage diodes;
   a p+ type doped layer that extends under the plurality of photodiodes and under the plurality of charge storage diodes parallel to the surface, wherein the p+ type doped layer comprises a plurality of openings through which charge carriers pass from the bulk portion of the silicon substrate to the photodiodes; and
   a plurality of compensating n− type doped implant regions, wherein each compensating n− type doped implant region is formed in a respective one of the openings.

12. The image sensor defined in claim 11 further comprising a plurality of p− type doped implant regions, wherein each p− type doped implant region is interposed between a respective one of the photodiodes and a respective one of the compensating n-type doped implant regions, wherein each p− type doped implant region is aligned with the respective compensating n− type doped implant region.

13. The image sensor defined in claim 12 wherein the p-type doped layer is connected to ground biased layers.

14. The image sensor defined in claim 12 further comprising:
   a plurality of first transfer gates formed on the surface of the silicon substrate;
   a plurality of second transfer gates formed on the surface of the silicon substrate; and
   a plurality of floating diffusion nodes formed in the surface of the silicon substrate, wherein each of the first transfer gates transfers charge carriers from a respective one of the photodiodes to a respective one of the charge storage diodes, and wherein each of the second transfer gates transfers the charge carriers from an associated one of the charge storage diodes to an associated one of the floating diffusion nodes.

15. A system, comprising:
   a central processing unit;
   memory;
   input-output circuitry; and
   an image sensor pixel in a pixel array having a silicon substrate, comprising:
      a photodiode and a charge storage diode formed in a surface of the silicon substrate, wherein the silicon substrate includes a bulk portion under the photodiode and the charge storage diode;
      a p+ type doped layer that extends under the photodiode and under the charge storage diode parallel to the surface, wherein the p+ type doped layer comprises an opening through which charge carriers pass from the bulk portion of the silicon substrate to the photodiode; and
      a compensating n-type doped implant region in the opening.

16. The system defined in claim 15 further comprising a p-type doped implant region interposed between the photodiode and the compensating n-type doped implant region, wherein the p− type doped implant region is aligned with the compensating n-type doped implant region.

17. The system defined in claim 16 wherein the p− type doped layer is connected to ground biased layers.

18. The system defined in claim 16 wherein the image sensor pixel further comprises a transfer gate formed on the surface of the silicon substrate, wherein the transfer gate transfers charge carriers from the photodiode to the charge storage diode.

19. The system defined in claim 18 wherein the image sensor pixel further comprises a floating diffusion node.

20. The system defined in claim 19 wherein the image sensor pixel further comprises an additional transfer gate formed on the surface of the silicon substrate, wherein the additional transfer gate transfers the charge carriers from the charge storage diode to the floating diffusion node.

* * * * *